(12) United States Patent
Jambor et al.

(10) Patent No.: US 7,745,733 B2
(45) Date of Patent: Jun. 29, 2010

(54) GENERIC PATTERNED CONDUCTOR FOR CUSTOMIZABLE ELECTRONIC DEVICES

(75) Inventors: George F. Jambor, Slinger, WI (US); Michael J. Robrecht, Shorewood, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 1458 days.

(21) Appl. No.: 11/120,025

(22) Filed: May 2, 2005

(65) Prior Publication Data

US 2006/0246379 A1 Nov. 2, 2006

(51) Int. Cl.
*H05K 1/00* (2006.01)
(52) U.S. Cl. .................. 174/254; 174/255; 361/749
(58) Field of Classification Search ............ 174/255, 174/254; 361/749–751
See application file for complete search history.

(56) References Cited

U.S. PATENT DOCUMENTS

| | | | |
|---|---|---|---|
| 3,634,602 A | 1/1972 | Vom Bruck | |
| 3,773,989 A | 11/1973 | Hacon | |
| 4,446,188 A | 5/1984 | Patel et al. | |
| 5,062,016 A | 10/1991 | Zupancic | |
| 5,062,916 A * | 11/1991 | Aufderheide et al. | 156/269 |
| 5,418,551 A | 5/1995 | Ise | |
| 5,491,706 A | 2/1996 | Tagawa et al. | |
| 5,543,589 A | 8/1996 | Buchana et al. | |
| 5,543,590 A | 8/1996 | Gillespie et al. | |
| 5,544,018 A | 8/1996 | Sommerfeldt et al. | |
| 5,945,980 A | 8/1999 | Moissev et al. | |
| 6,819,316 B2 | 11/2004 | Schulz et al. | |

FOREIGN PATENT DOCUMENTS

| | | |
|---|---|---|
| EP | 0 471 149 | 2/1992 |
| GB | 2 207 815 | 2/1989 |
| WO | WO 93/26144 | 12/1993 |

OTHER PUBLICATIONS

U.S. Appl. No. 11/025,559, Robrecht, Michael J. and Jambor, George F., "Registered Lamination of Webs Using Laser Cutting" filed Dec. 29, 2004, 23 pgs.

* cited by examiner

*Primary Examiner*—Jeremy C Norris
(74) *Attorney, Agent, or Firm*—Johannes P. M. Kusters

(57) ABSTRACT

A method of making a multilayered product having a repeating conductive pattern that includes determining a repeating pattern configuration such as a grid of conductive traces for use in a range of active element configurations, and forming a continuous web of multilayered product having at least one layer of conductive material configured according to the determined repeating pattern configuration. The continuous web is suitable for use in a range of active element configurations. The method may also include altering the continuous web to form a customized active element. Forming the continuous web may include providing a first roll of continuous webbing stock, the first roll having at least a portion of the repeating pattern formed thereon, providing a second roll of continuous webbing stock, the second roll having at least a portion of the repeating conductive pattern formed thereon, and laminating the first and second rolls of continuous webbing stock together.

7 Claims, 8 Drawing Sheets

DETERMINING A REPEATING CONDUCTIVE PATTERN CONFIGURATION FOR USE IN A RANGE OF ACTIVE ELEMENT CONFIGURATIONS

↓

FORMING A CONTINUOUS WEB OF MULTILAYERED PRODUCT HAVING AT LEAST ONE LAYER OF PATTERNED CONDUCTIVE MATERIAL THE LAYER CONFIGURED TO FORM THE REPEATING CONDUCTIVE PATTERN WHEN ASSEMBLED

↓

WHEREIN ANY OF THE RANGE OF ACTIVE ELEMENT CONFIGURATIONS CAN BE FORMED FROM THE CONTINUOUS WEB

*Fig. 10*

GENERIC PATTERNED CONDUCTOR FOR CUSTOMIZABLE ELECTRONIC DEVICES

The present invention relates to manufacturing processes and related products wherein a multilayered product is formed for use in a variety of different electronic element configurations.

BACKGROUND

Multilayered products for use in electronic devices or elements typically include spaced apart conductive circuits that are formed on separate layers of flexible polymer-based film, webbing, or insulating laminate layers. One common method for producing this type of product is to form the customized circuits on individual sheets of plastic film and then join the two sheets of film together after the two circuits have been completely formed. The sheets may be joined together using, for example, a lamination process. This technique can be expensive and entail difficult and time-consuming hand lay-up and registration operations, particularly when the plastic films are very thin, for example, in the range of about 1 mil to 10 mils (25-250 micrometers) thick. The separate films are typically hand registered in stacks and then laminated with rollers or in a press or autoclave under heat and pressure.

Another technique for forming multilayered products includes laminating rolls of web with other layers of web or laminate. The roll of completed product may be cut to any desired length. This technique has certain drawbacks as well. A circuit positioned in the continuous roll of laminated webbing can be difficult to access for the purpose of coupling to a circuit board or to a hard wire connection. Circuit parts can be positioned such that the tail area of a part is exposed along a side of the web for connection as described in U.S. Pat. No. 5,062,016. When this technique is used for a grid type circuit in which conductive traces are aligned in orthogonal X and Y directions, leads to the conductive traces must extend to the sides of the web in order to be exposed for later connection. This restriction on the routing and access points of the conductive traces can result in limitations related to manufacturing efficiency, cost-effective production of parts, and design options for the circuit components and electronic devices that use those components.

Touch screens and electromagnetic digitizers are two types of electronic sensing elements that use a multilayered product. The popularity of technologies that use such sensors has increased significantly over the past several years. Many different technologies have been explored in an effort to produce a high-quality sensor that is reliable and cost effective. Examples of sensor technologies include capacitive, resistive, near field imaging (NFI), acoustical wave, infrared, and force. Common applications for such sensors include computer monitors and mobile and handheld devices, such as personal digital assistants (PDAs) and tablet computers.

Sensors, like many other types of electronic elements or devices that utilize multilayered products, can have many different size and shape limitations. Different sensors may have different requirements for conductive elements and electrically active features in the multilayered product. A single multilayered product and related methods of making such products that can be customized for use in different end products would be an advance in the art.

SUMMARY

The present invention generally relates to systems and manufacturing processes wherein a multilayered product is formed for use in a variety of different electronic element configurations, and which allows at least some customization or alteration of layers during the formation process even if final customization steps are not completed until near the end of the manufacturing process. The multilayered product includes different portions of a repeating generic conductive pattern formed on separate webbing layers. The webbing layers are combined using, for example, lamination techniques in a way in which the portions of repeating conductive pattern are registered to provide the repeating generic conductive pattern with relative precision. The completed multilayered product preferably includes a conductive pattern that is common or generic to many different end product configurations. The conductive pattern may be continuous or semi-continuous along a length or across a width of the multilayered product.

Another aspect of the invention relates to a method of making a multilayered product having a repeating conductive pattern. The method includes determining a repeating pattern configuration, such as a grid of conductive traces, for use in a range of active element configurations. The method also includes forming a continuous web of multilayered product having at least one layer of conductive material configured according to the determined repeating pattern configuration. The continuous web is suitable for use in a range of active element configurations. The method may also include altering the continuous web to form a customized active element. Forming the continuous web may include providing a first roll of continuous webbing stock, the first roll having at least a portion of the repeating pattern formed thereon, providing a second roll of continuous webbing stock, and laminating the first and second rolls of continuous webbing stock together.

Another aspect of the invention relates to a continuous multilayered product having a repeating conductive pattern. The multilayered product includes a first layer of continuous webbing, a second layer of continuous webbing, and at least a portion of the repeating conductive pattern formed on each of the first and second layers of continuous webbing. The multilayered product is configured for customized use in any of a plurality of end products that require the repeating conductive pattern. An example end product is a touch sensitive device.

A further aspect of the invention relates to a method of making a plurality of differently configured electronic elements. The method includes defining a repeating conductive pattern common to the plurality of electronic elements, and forming a continuous web of multilayered product having at least two separate layers of conductive material that together compose the repeating conductive pattern. Other steps of the method include providing design parameters for the different electronic element configurations, and modifying the multilayered product according to the design parameters to make the plurality of electronic elements. Some of the modifying may occur during formation of the multilayered product to provide features common to the different of electronic elements and other modifying may occur after the step of forming the continuous web of multilayered product to provide features unique to the different electronic elements.

BRIEF DESCRIPTION OF THE DRAWINGS

FIG. 10 is a flow diagram showing steps of another example method of forming a multilayered product according to principles of the present invention.

DETAILED DESCRIPTION

Figure 1:
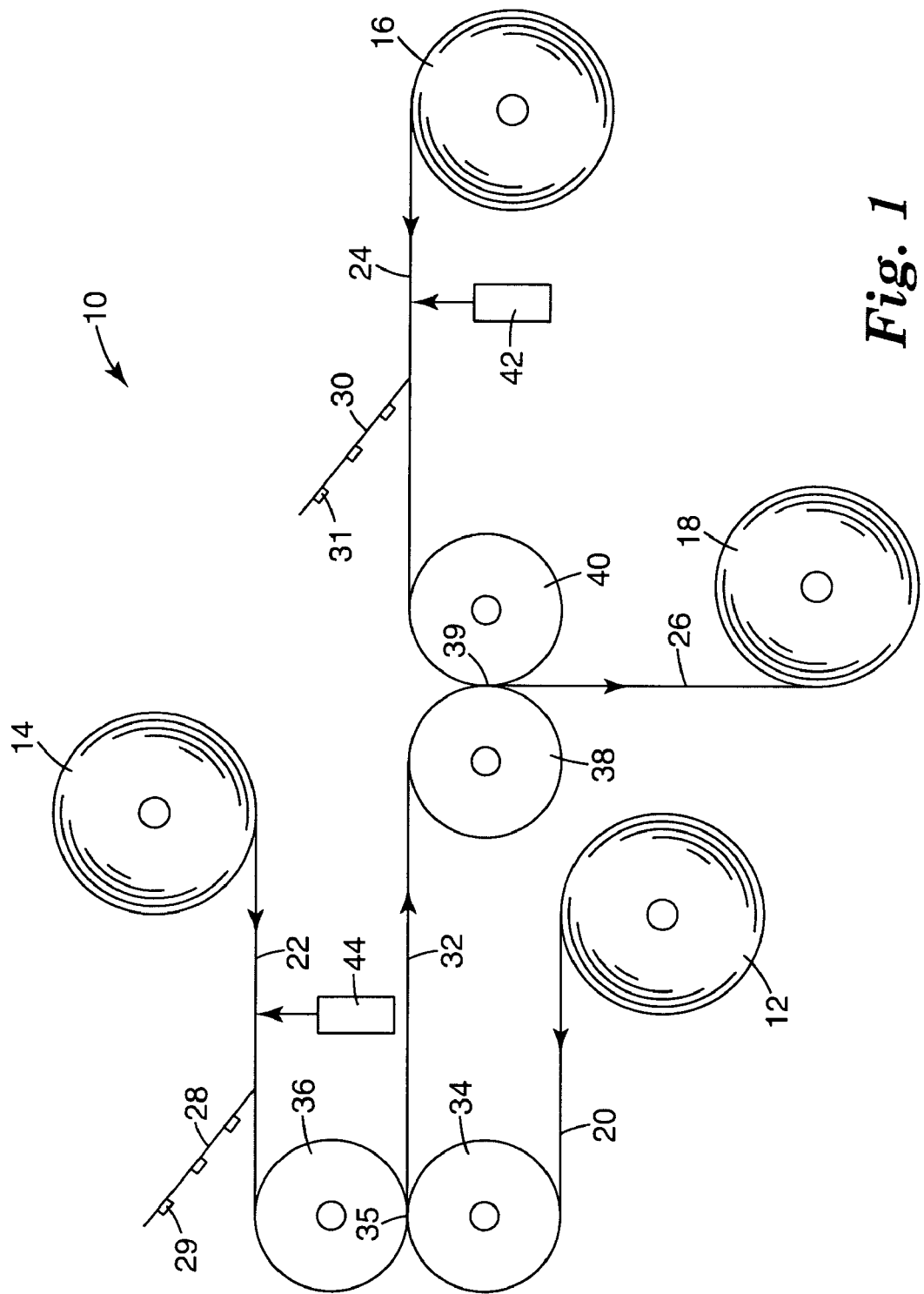
FIG. 1 is a schematic drawing illustrating an example system according to principles of the present invention.

The present invention generally relates to manufacturing processes and methods wherein a multilayered product is formed for use in a variety of different electronic element configurations. Systems configured to implement those manufacturing processes and methods are also included within the scope of the present invention. An example multilayered product may include one or more continuous webbing members, a laminate layer, and one or more portions of a repeating conductive pattern that are assembled. The process of forming the multilayered product may include registering or otherwise relatively positioning conductive traces disposed on each webbing member to form the repeating conductive pattern of the multilayered product. The repeating conductive pattern may be continuous or semi-continuous along a length or across a width of the multilayered product. The process of forming may also include pre-customization of the multilayered product to include features generic to a plurality of different electronic elements that are formed from the multilayered product. The process of forming may further include registering or otherwise relatively positioning portions of the conductive traces with other features of the multilayered product such as, for example, vias or graphics.

Processes according to the present invention can allow for streamlined manufacturing while providing a high degree of flexibility, even when manufacturing highly customized products. Rather than assembling pre-designed and fully or nearly fully customized layers that are unique to a single electronic element configuration, the present invention allows for assembly of patterned layers into a multilayer structure that may include pre-customization of some features, but that is still generic to multiple electronic element configurations. Some example customized features of the multilayered product that may be provided during formation of the multilayered product include printing graphics and cutting vias in portions (e.g., laminate layer, continuous webbing member, etc.) of the multilayered product.

By designing the patterns of each of the layers according to a "least common denominator" that can be used across an intended range of final device configurations, continuous webs of the patterns can be laminated or otherwise assembled into large sheets, rolls or webs that can be immediately converted or stored for later customization. This can result in more efficient manufacturing with less waste, and allow for roll-to-roll processes where before such processes had been difficult due to issues of maintaining alignment of pre-customized parts that are unique to a single electronic element configuration.

Prior processes for generating a multilayered electronic element or device that includes multiple layers of webbing and conductive material spaced between the layers involved at least the following sequence of steps:

designing a part corresponding to a specific Stock Keeping Unit (SKU), the part having a specifically designed pattern of electronic elements, including the conductive material arrangement, access to the conductive material and creation of associated custom tooling such as screens, stencils or dies;

manufacturing the layers and providing features of the electronic element based on the SKU-specific design, including registering or aligning the patterns of conductive material on each layer, cutting vias or openings to expose the conductive material, adding or coupling components to the conductive material, and inventorying of said specific conductive components; and assembling including singulation of electronic element layers; and mechanical alignment of said layers in an assembly or lamination.

Such a process involves several potential disadvantageous aspects. First, the tooling and machinery set up required for manufacturing the multilayered electronic element must be changed for every SKU-specific design. The time and effort as well as the different tooling for each set up can result in relatively high costs that add to the per unit costs. Second, all steps of the manufacturing must be performed for every SKU-specific design. This results in what can be costly repetition of functions between different set ups that further increases costs and production times. Third, adverse precession issues involved in registering the conductive material among the separate webbing layers preclude utilization of web lamination or assembly for said layers. Precession can be, in many instances, one of the most costly and time consuming problems associated with manufacturing a multilayered electronic element. Correcting precession involved shifting, sheeting, stretching, or otherwise moving the webbing layers to register the conductive material on each webbing layer to provide a layout of the conductive material with a desired level of precision. Fourth, these highly customized processes can result in significant waste of webbing and other materials when the electronic element is smaller than the multilayered stock size.

Touch sensors and electromagnetic digitizers are typically custom manufactured electronic elements that are formed using processes such as described in the preceding paragraph. The customization of the sensor includes at least the printing and patterning of active zones and conductive traces on various layers of the sensor before and during assembly. A common pattern for the conductive traces is a grid of orthogonal lines. Customization of a sensor requires custom tooling for each application and size of sensor. The changing and customization of tooling requires relatively long lead times for processing of sub-components and sub-assemblies and can require extended lead times for design and engineering efforts related to tooling and prototyping. Furthermore, registration of the conductive traces amid various layers of the sensor can be difficult due to precession issues typically inherent in web processing, for example, due to variations in tooling, changes in temperature or changes in humidity.

There is a benefit to producing generic constituent components for the sensors. Such generic components may require a few customization steps at the final stages of manufacturing the sensor, such as cutting the generic component to a specific size in order to provide multiple different sensor configurations from a single generic component. This "single step" or "final step" customization of a generic component typically would require little SKU-specific tooling. Furthermore, soft tooling methods such as computer controlled laser cutting may be employed. The present invention, described with reference to several examples described below and illustrated in the Figures, relates to such generic components and the manufacture and construction of those components for use in a variety of electronic elements. Principles of the present invention can provide many advantages related to improved efficiency in producing electronic elements such as reduced production times, decreased costs, separating the customization step in space and time from the production of the generic constituent components, and so forth.

Referring to FIG. 1, an example system 10 configured for generating a multilayer product having two layers of conductive elements is shown and described. The system 10 is exemplary only and may be modified or altered in numerous ways to provide for different multilayer products having different numbers of layers, different types and patterns of conductive elements, and different means of monitoring and/or altering the various layers during the process of combining the layers using the system 10. Another example system that may be used in conjunction with principles of the present invention is shown and described in commonly assigned U.S. patent application Ser. No. 11/025,559 filed on Dec. 29, 2004, and entitled REGISTERED LAMINATION OF WEBS USING LASER CUTTING, which application is incorporated herein by reference in its entirety.

The system 10 includes a first roll 12 of a first continuous webbing layer 20 having a first conductive pattern or a first portion of a conductive pattern. A second roll 14 includes a second layer of continuous webbing 22 having a second conductive pattern or second portion of a conductive pattern and a removable liner 28. A third roll 16 includes a continuous laminate layer 24 that includes a removable liner 30. A fourth roll 18 includes a continuous multilayer product 26 having a continuous generic conductive pattern (a combination of the first and second patterns) that can be used in a range of active element configurations in finished products.

The system 10 also includes a first pair of nip rollers 34, 36 that define a nip point 35. The nip rollers 34, 36 direct the first webbing 20 and the second layer 22, respectively, toward the nip point 35 wherein the layers 20, 22 engage each other to form a combined layer 32.

A second pair of nip rollers 38, 40 define a second nip point 39. The nip rollers 38, 40 direct the combined layer 32 and the laminate webbing 24, respectively, toward the nip point 39 where the layers 32, 24 engage each other to form the continuous multilayer product 26.

The system 10 may also include first and second cutting devices 44, 42 associated with the webbing 22 and laminate layer 24, respectively. The cutting devices may be programmed to cut webbing 22 and layer 24 at locations that correspond to positions of the conductive pattern formed on the webbing 22 and the webbing 20. The system may further include encoders (not shown) and imaging devices (not shown) as described in the U.S. Ser. No. 11/025,559 patent application noted above to help ensure proper registration of the cuts or vias formed by the cutting devices 44, 42. Preferably, the cuts or vias formed by laser 44 align with cuts or vias formed by cutting device 42 when the combined layer 32 engages the webbing 24 at nip point 39. Such registration provides access to the conductive pattern formed on the webbing 20 through the layer 22 and the webbing 24.

The removable liners 28, 30 associated with the webbing 22 and the layer 24 may be useful for both covering an adhesive and removing the waste slug resulting from the cut by the cutting devices 44, 42. Such removal of the waste slug using kiss cutting to a releasable liner can provide elimination of an intermediate step of handling of the webbing 22 and layer 24 to remove the waste slug.

The cutting of vias and registration of portions of the conductive pattern during formation of the multilayered product 26 may be considered "pre-customization" of multilayered product for use in an identified electronic element configuration. While these and other pre-customization steps may be taken to provide desired features in the multilayered product, the resulting features should still be generic to more than one electronic element configuration. Further customization of the multilayered product after its formation is necessary to provide completed electronic elements having different configurations.

Figure 2:
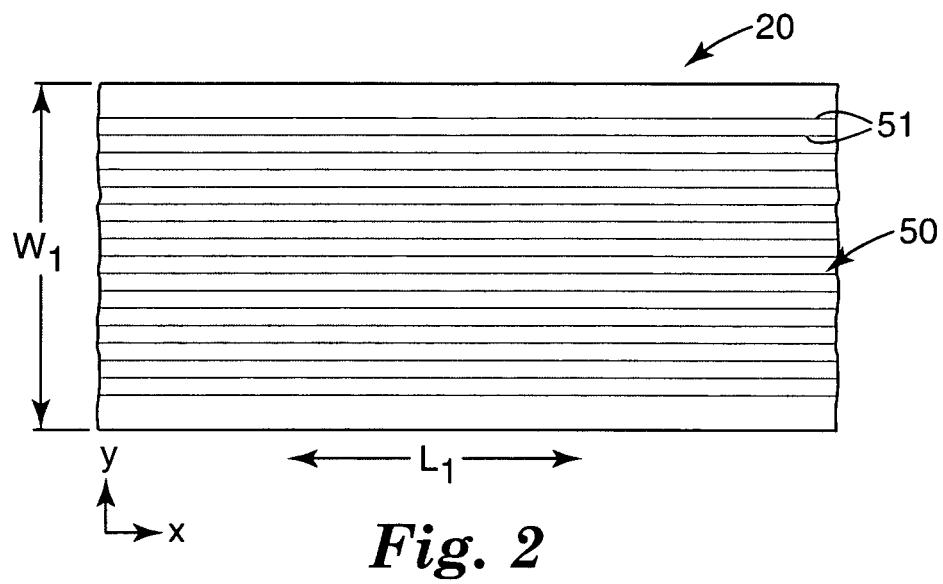
FIG. 2 illustrates a portion of an example first carrier layer having a first conductive pattern formed thereon for use in the system shown in FIG. 1.

Referring now to FIG. 2, a top view of a portion of the first continuous webbing 20 is shown. The webbing 20 includes a plurality of longitudinally aligned traces 51 that define the first conductive pattern 50. The pattern 50 is merely exemplary of one of many conductive patterns that may be applicable to the present invention. The conductive traces 51 extend continuously along substantially the entire length $L_1$ (X direction) of the webbing 20 and are unbroken. The traces 51 are also equally spaced apart across a width $W_1$ (Y direction).

In some embodiments, the conductive traces 51 may have unequal spacing or may have a repeated pattern of spacing across the width $W_1$. In many embodiments, the spacing across the width $W_1$ is less significant than the requirement that the spacing between each individual trace 51 remains constant along the length $L_1$ of the layer 20. In this way, the conductive pattern 50 maintains its generic nature along the length $L_1$, thereby making the design precession proof and enabling web lamination. In still further embodiments, the conductive traces 51 may have different configurations such as being, for example, non-linear, broken along the length $L_1$, or having portions that extend across the width $W_1$. Each of these various embodiments or configurations for the traces 51 are possible so long as each individual trace or portion of the conductive pattern 51 repeats its configuration along the length $L_1$.

Figure 3:
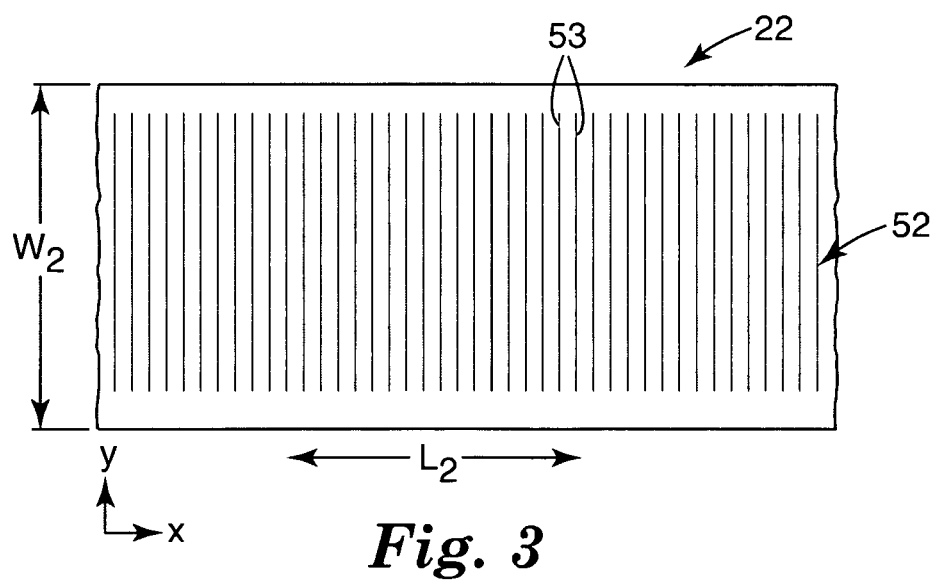
FIG. 3 illustrates a portion of an example second carrier layer having a second conductive pattern formed thereon for use in the system shown in FIG. 1.

Referring now to FIG. 3, a top view of a portion of the second continuous webbing 22 is shown. Webbing 22 includes a plurality of laterally extending traces 53 that define a second conductive pattern 52. The conductive traces 53 extend across substantially the entire width $W_2$ of the webbing 22 and are equally spaced apart along the length $L_2$. The configuration of the second conductive pattern 52 is exemplary only and may be modified to include the same or similar configurations as described above with reference to the first conductive pattern 50. For example, the traces 53 may be unequally spaced along the length $L_2$, may be non-linear or have portions that are non-linear across the width $W_2$, or may be broken across the width $W_2$. The pattern 52 may contain shaped geometry such as diamonds, waves, lines or any other desired pattern, for example those disclosed in U.S. Pat. Nos. 5,418,551 5,491,706; 5,543,589; 5,543,590; and 5,945,980, each of which is wholly incorporated into this document. The second conductive pattern 52 may have these or any other configurations and be well suited for use according to the principles of the present invention so long as there is a repeating pattern for the traces 53 along the length $L_2$.

Figure 4:
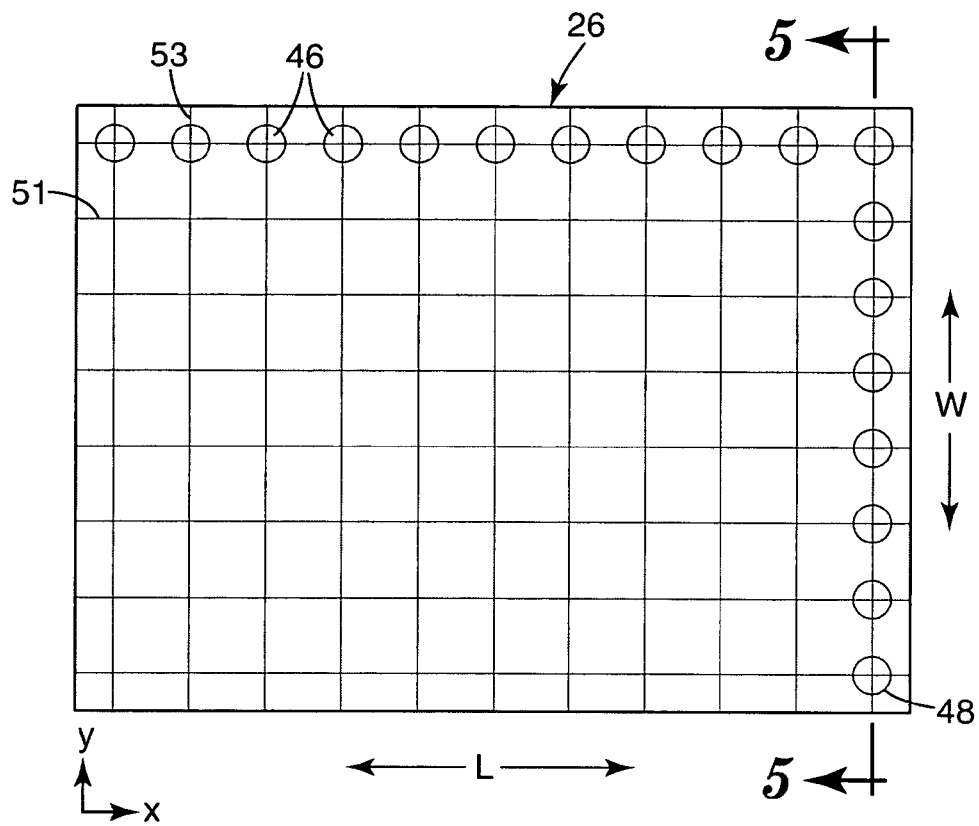
FIG. 4 illustrates a portion of an example continuous multilayered product formed using the system shown in FIG. 1 and the carrier layers shown in FIGS. 2 and 3.

When the webbings 20 and 22 are used to create an electronic element for a sensor, the configuration of the first and second conductive patterns 50, 52 may be particularly useful for creating a conductive grid as shown in FIG. 4. Such a grid is generic as to its pattern in the X and Y directions (across the width W and along the length L). This even spacing of the traces 51, 53 creates a grid that can be useful for determining the location of a finger touch or an inductively powered or tethered stylus or puck applied to a device utilizing the grid pattern.

Figure 5:
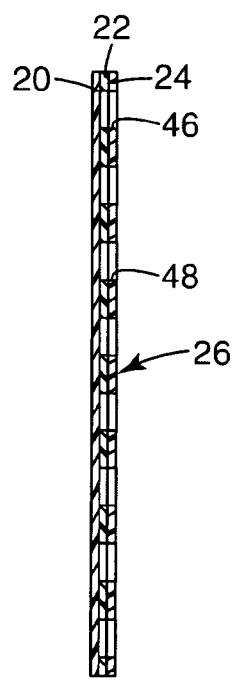
FIG. 5 illustrates a cross sectional view of the multilayered product shown in FIG. 4 taken along indicators 5-5.

FIG. 4 illustrates a top view of a portion of the multilayer product 26 that may result from combining the webbings 20, 22 and the laminate layer 24 using the system 10. FIG. 4 illustrates only a portion of the multilayer product 26. A plurality of vias 46 are formed in the X direction along the length L, and a plurality of vias 48 are formed in the Y direction across the width W. Preferably, each of the vias 46, 48 extend through both the webbing 22 and laminate layer 24 as shown in the cross section of FIG. 5. In other embodiments, the vias 46, 48 may extend through only one of the webbing 22 and laminate layer 24, or may extend completely through all of the webbings 20, 22 and laminate layer 24.

As described above, providing vias through certain layers of the multilayer product 26 can provide access to the conductive traces 51, 53. With a portion of the traces 51, 53 exposed, an electrical connection can be made by filling the vias with a conductive material such as solder, conductive paste, a connector, or coupling member, whereby the traces 51, 53 are coupled with an electrical connection to a connecting member. The traces 51, 53 can be electrically coupled to another electronic component or device. In a sensor application, such an electrical connection can provide coupling of the traces 51, 53 to a controller that is used to determine location of a finger touch or inductively powered or tethered stylus or puck within the grid defined by the traces 51, 53.

The multilayer product generated by a system similar to system 10 may include only a single webbing member having a single conductive pattern that is covered using, for example, a separate laminate layer. In this and other embodiments, the laminate layer may be sized such that portions of the conductive pattern are exposed for electrical connection. The laminate layer may also include vias such as those shown in FIG. 4 across a length or along the width of the continuous webbing to provide access to portions of the conductive pattern at specific locations. Likewise, three or more conductive patterns may be provided on separate webbing layers and separated from each other in various ways such as with laminate layers.

Figure 6:
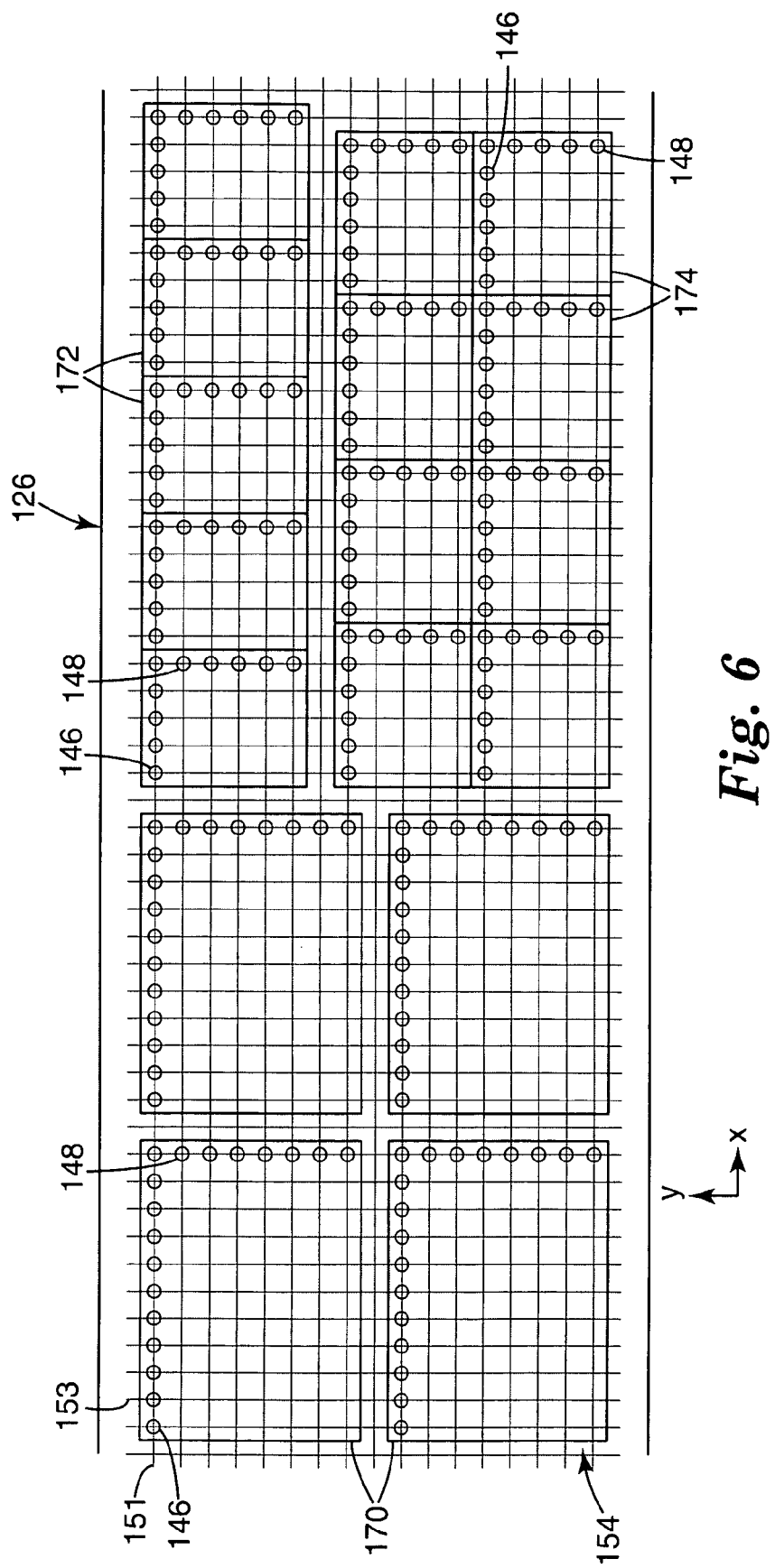
FIG. 6 illustrates a portion of another example continuous multilayered product formed using the system shown in FIG. 1 and the carrier layers shown in FIGS. 2 and 3, and further including outlines for different active elements.

Referring now to FIG. 6, an example continuous multilayer product 126 is shown including a plurality of conductive traces 151, 153 that define a continuous generic grid pattern 154. FIG. 6 illustrates how a plurality of different electronic element configurations may be formed from a single continuous generic conductive pattern on a continuous multilayer product 126. FIG. 6 illustrates first, second and third electronic element configurations 170, 172, 174 that each have a different shape and size. Each of the configurations 170, 172, 174 include a portion of the grid pattern 154 and further include rows of vias 146 along the X direction and a plurality of vias 148 extending in the Y direction. By cutting each of the configurations 170, 172, 174 along the boundaries between each of those members, several electrically conductive devices or products can be generated using the same continuous multilayer product 126.

FIG. 6 also illustrates that several different electronic element configurations can be provided in the Y direction as well as along the length in the X direction of the multilayer product 126. Therefore, greater flexibility is provided for creating a desired electronic element configuration and for maximizing the efficient use of all of the multilayer product 126 (e.g., with little waste product resulting). The "continuous" nature of the multilayered product 126 and the "continuous" nature of the repeating conductive pattern are significant enough that more than one different electronic element configuration can be cut across a width or along a length of the multilayered product 126. The repeating conductive pattern may also be "semi-continuous" in nature while providing more than one different electronic element configuration to be cut from the multilayered product. A semi-continuous pattern may include breaks or discontinuities in the conductive pattern along a length or across a width of the multilayered product. However, these breaks or discontinuities preferably are arranged at predictable intervals or in locations that reduce problems associated with registering various portions of the pattern or registering portions of the pattern with other features of the multilayered product (e.g., vias and graphics).

While using size as a customization parameter is illustrated in FIG. 6, other customization parameters may be used in other embodiments. For example, the multilayer product 126 may be modified by providing further vias, adding additional layers, making electrical connections to the grid pattern 154, stretching, compressing, or other means of modifying the multilayer product 126 prior to or in place of the step of cutting.

In one example embodiment, the pitch or spacing between the conductive traces 151, 153 of the grid 154 is about 1 mm to about 25 mm. Preferably, the pitch in both the X and Y direction is about 2 mm to 4 mm and most preferred at about 3 mm. This standard pitch spacing of about 3 mm will provide a grid spacing that is useful for many sensor applications. Several other standard pitches may be used for special sensor applications. The use of a grid for other applications outside of sensors may have an even broader range of pitch spacings and may have varying spacings between the X and Y oriented conductive traces.

Figure 7A:
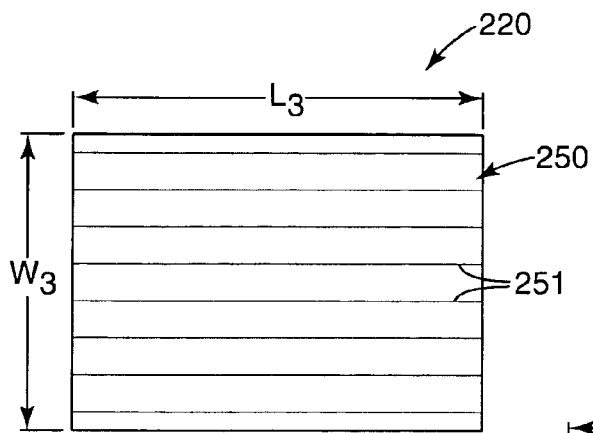
FIGS. 7A-C illustrate different layers of another example multilayered product.
Figure 7B:
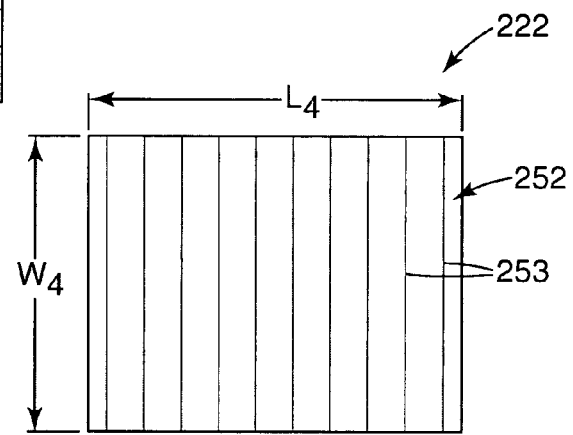
Figure 7C:
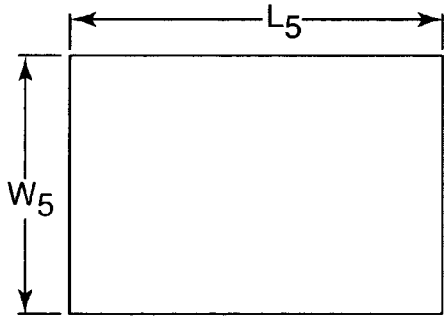
Figure 8:
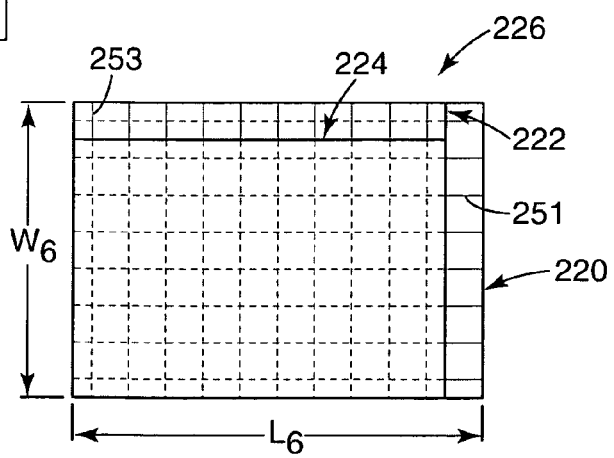
FIG. 8 illustrates a multilayered product formed using the layers shown in FIGS. 7A-C.

Referring now to FIGS. 7-8, another example method of creating a multilayer product is described. The method with reference to FIGS. 7-8 utilizes sheets cut from rolls of webbing having generic conductive patterns formed thereon. FIG. 7A illustrates a first sheet 220 having a conductive pattern 250 that includes a plurality of conductive traces 251 formed thereon. The traces 251 extend along the length $L_3$ and are equally spaced across the width $W_3$. FIG. 7B illustrates a second sheet 222 that includes a conductive pattern 252 comprising a plurality of conductive traces 253. The traces 253 extend along the width $W_4$ and are equally spaced across the length $L_4$. FIG. 7C illustrates a third sheet 224 that serves as a cover sheet and has a width $W_5$ and length $L_5$. The sheet 220 is formed from a continuous roll of webbing that includes the traces 251. The sheet 222 is cut from a continuous webbing having traces 253. The sheet 224 is cut from any desired stock material.

The length $L_4$ of the sheet 222 is slightly less than the length $L_3$ of sheet 220. The length $L_5$ and width $W_5$ are less than both the length $L_3$ and width $W_3$, respectively, of the sheet 220. The sheets 220, 222 may be cut in register such that the conductive traces 251, 253 are at known locations relative to the edges of the cut sheets 220, 222.

The three sheets 220, 222, 224 are laminated together into a multilayer product 226 as shown in FIG. 8. The traces 251 are exposed along one end of the multilayer product 226 due to the difference in length between $L_3$ and the lengths $L_4$ and $L_5$. The conductive traces 253 are exposed along another side of multilayer product 226 due to the difference between widths $W_4$ and $W_5$. With this configuration, the traces 251 and 253 can be exposed for electrical coupling while still providing a substantial surface area that can be used as a target surface for the desired application (e.g., a sensor touch surface). Further, either side of the combination of sheets shown in FIG. 8 can be used as the target surface. If the generic pattern of traces 251 and 253 are identical, the same base patterned substrate material, as exemplified in FIG. 2 or FIG. 3, may be used to create the sheets 220 and 222.

The methods involved in generating the multilayer product 226 can utilize standard sheeting and laminating equipment to provide a desired exposure of the conductive traces 251, 253. Thus, the use of relatively expensive cutting equipment such as the cutting devices 42, 44 described with reference to FIG. 1 can be eliminated in order to expose the conductive traces for electrical connection.

Figure 9:
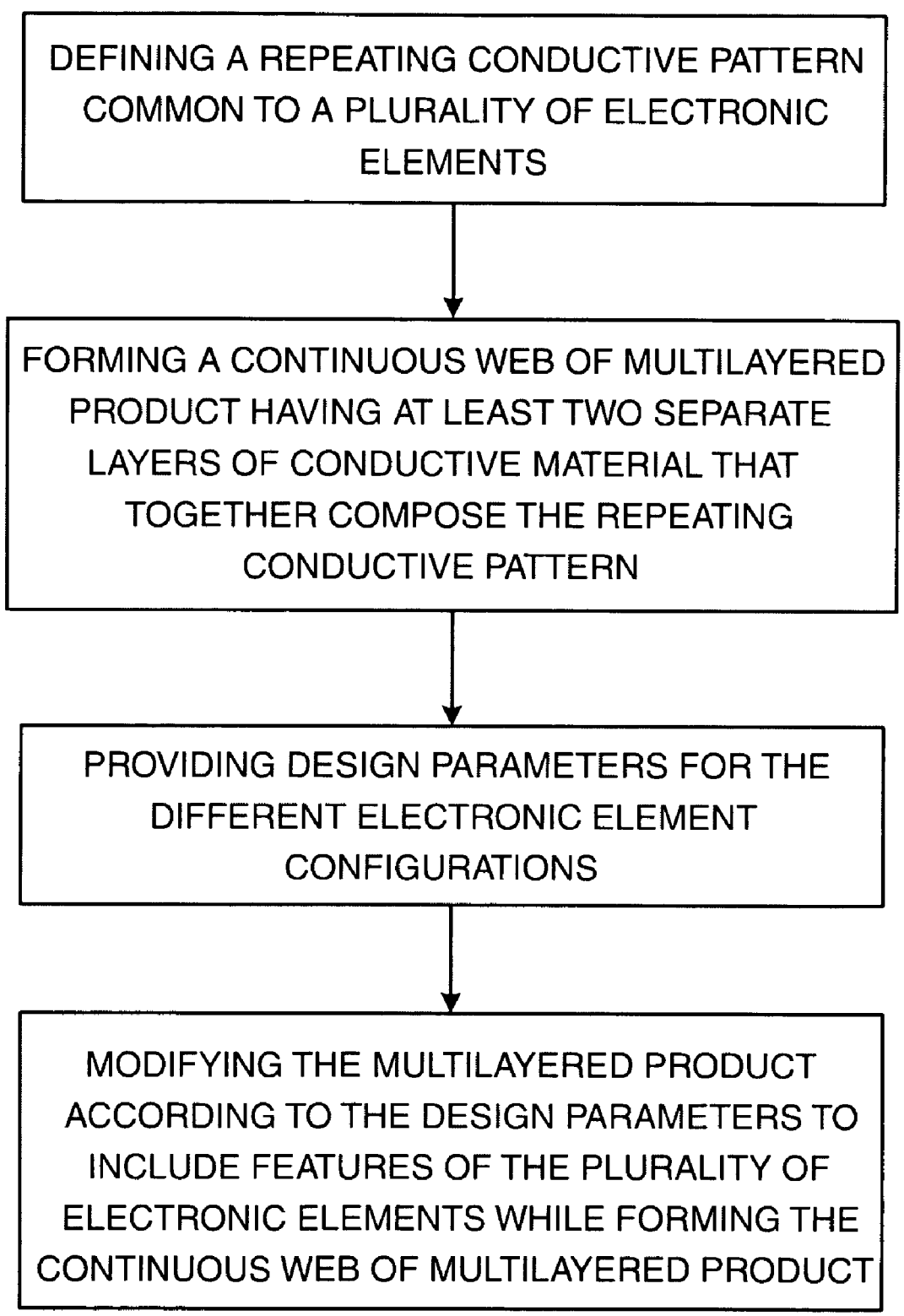
FIG. 9 is a flow diagram showing steps of an example method of forming a multilayered product according to principles of the present invention.
Figure 11:
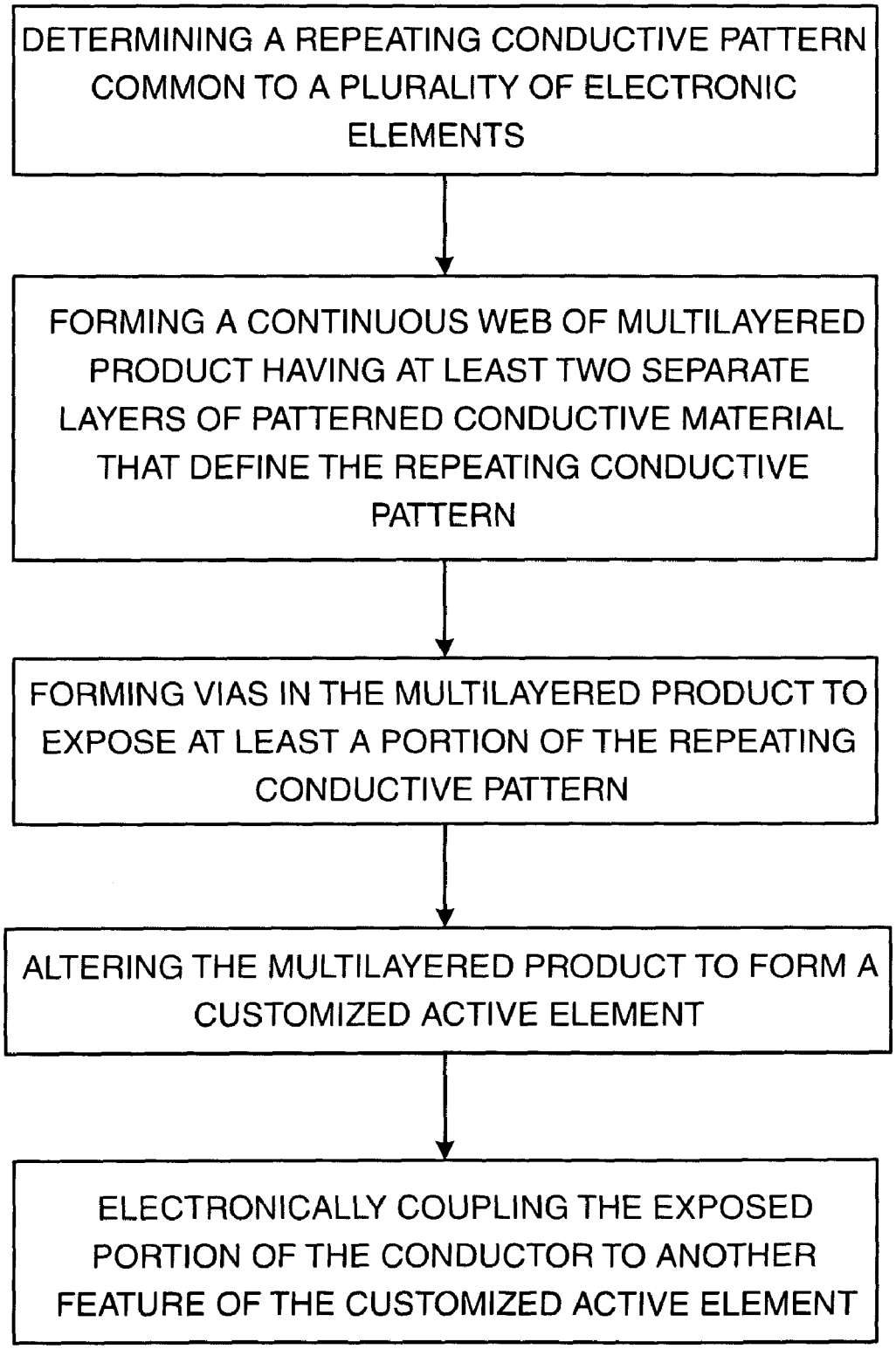
FIG. 11 is a flow diagram shown steps of an example method of forming an electronic device according to principles of the present invention.

Referring now to FIGS. 9-11, some example methods related to the principles of the present invention are illustrated. FIG. 9 describes steps of a method of making a plurality of differently configured electronic elements. One step of the method includes defining a repeating conductive pattern common to the plurality of electronic elements. The method advances the purpose of creating a multilayer product wherein the repeating conductive pattern can be used in different electronic element configurations, thus improving the overall value in creating the multilayer product. The more uses and applications for the resulting multilayer product, the more savings related to the costs of tooling, setup, engineering and design, and other considerations can be added to the net value of producing that multi-use, multilayer product.

Another step involved in the method of FIG. 9 includes forming a continuous web of multilayer product having at least two separate layers of conductive material that together compose the repeating conductive pattern. This step of forming can be accomplished in many different ways, including, for example, the steps involved in operating the system as previously described. The continuous nature of the web of multilayer product lends itself to use for many different customized electronic elements, wherein the roll of continuous product can be fed through many different processes or tooling setups to create the desired end product. Repeating pattern configurations are advantageous in that they can be used for many different active element configurations and can produce numerous products from a single continuous web.

An advantage related to providing at least two separate layers of conductive material in the multilayered product involves precession issues, as previously discussed. By addressing precession (e.g., variations, oscillations, misalignment) of the layers of conductive material while forming the multilayered product, similar precession issues are avoided during manufacturing customization. Further, precession issues can often be more easily resolved when generating a continuous generic multilayered product because those issues can be compensated for in real time during the lamination process.

A further step of the method of FIG. 9 includes providing design parameters for the different electronic element configuration. If the continuous web were suitable for only a single electronic element configuration, the overall value of a continuous web would be minimized.

Another step of the method of FIG. 9 includes modifying the multilayered product according to the design parameters to make the plurality of electronic elements after the step of forming the continuous web of multilayered product. This sequence of steps provides advantages in making the plurality of electronic elements using the same multilayered product, as described above.

FIG. 10 illustrates the steps of another example method of making a multilayer product. As with the method associated with FIG. 9, an important step includes determining a repeating pattern configuration for use in a range of active element configurations. Such a determination may include determining a pitch spacing between conductive traces that may be useful for a number of different active elements. Another step of the method of FIG. 10 includes providing a first roll of continuous webbing stock, wherein the first roll has at least a portion of the repeating pattern formed thereon. The portion of the repeating pattern may include, for example, continuous conductive traces extending along a length of the webbing stock, or may include a pattern of discreet electrical components positioned in a pattern, wherein the pattern repeats itself along the length of the webbing stock.

Another step in the method of FIG. 10 includes providing a second roll of continuous webbing stock. The second roll of continuous webbing stock includes another portion of the repeating pattern. In one example, the portion of repeating pattern formed on the second roll is a set of conductive traces that extend across a width of the webbing in a nonparallel orientation to the conductive traces of the first roll of webbing stock. Many other properties and characteristics for the second roll are possible.

A further step of the method of FIG. 10 includes laminating the first and second rolls of continuous webbing stock together to form a continuous web of multilayer product having a conductor according to the predetermined repeating pattern configuration. During or just prior to laminating the first and second rolls of webbing stock together, the positions of the pattern configuration on each roll may be acquired using, for example, a machine vision system, and at least one of the webs may be altered or cut in register to the patterns on one or both of the webs. Such registration may include adjusting a position of one webbing relative to the other in the transverse direction if needed.

The multilayer product may be altered to form a customized active element according to another step of the method of FIG. 10. Altering of the continuous web may include any number of different modifications or changes to the continuous web. One example alteration includes cutting the continuous web to a particular size desired for the customized active element.

Referring now to FIG. 1, a method of making a plurality of electronic devices each having a different configuration is described. The method includes forming a continuous web of multilayered product having at least two separate layers of conductive material that define a repeating conductive pattern. The multilayered product preferably includes a configuration and a construction that is generic for use in an optimized number of different electronic elements. Another step of the method includes providing design parameters for the different electronic element configurations. The method also includes modifying the multilayered product according to the design parameters to make the plurality of electronic elements after the step of forming the continuous web of multilayered product.

Using this sequence of steps, all of the electronic elements can be made using the same stock material; that of the continuous webs with generic conductive patterns. Further, the design parameters for each electronic element can be simplified because each set of design parameters includes the common generic conductive patterns, which have been completed prior to the customization step. This method further provides the opportunity to conduct the customization step at a time and location completely separate from the step of forming the continuous webs of generic conductive patterns. As a result, the process of forming the continuous multilayered product can optimized for improved cost, time, material usage and precision and customization can be completed under separate preferred conditions.

The above specification, examples and data provide a complete description of the manufacture and use of the invention. Since many embodiments of the invention can be made without departing from the spirit and scope of the invention, the invention resides in the claims hereinafter appended.

We claim:

1. A continuous multilayered product having a repeating conductive pattern, the multilayered product comprising:
   a first layer of continuous webbing having a least a first portion of the repeating conductive pattern formed thereon; and
   a second layer of continuous webbing having a least a second portion of the repeating conductive pattern formed thereon;
   wherein the repeating conductive pattern is configured so that the multilayered product is capable of being customized for use in any of a plurality of different end products that utilize the repeating conductive pattern as active elements, and wherein at least one of the first and second portions of the repeating pattern extends at least semi-continuously over a plurality of end products that utilize the repeating conductive pattern as active elements.

2. The multilayered product of claim 1, wherein customizing the multilayered product includes cutting the multilayered product to a predetermined size.

3. The multilayered product of claim 1, wherein the repeating conductive pattern includes a grid of conductive traces, a portion of the grid in the form of a plurality of spaced apart traces that extend along a length of the multilayered product being formed on the one of the layers of continuous webbing, and a portion of the grid in the form of a plurality of spaced apart traces that extend across a width of the multilayered product being formed on the another of the layers of continuous webbing.

4. The multilayered product of claim 1, wherein the first and second layers of continuous webbing are laminated together and the portions of repeating conductive pattern formed on each of the first and second layers of continuous webbing are electrically insulated from each other.

5. The multilayered product of claim 1, wherein the first or second portion of the repeating conductive pattern is encapsulated between the first and second layers of continuous webbing.

6. The multilayered product of claim 1, wherein at least one of the first and second layers of continuous webbing includes a via formed therein.

7. The multilayered product of claim 1, wherein the end product is a touch sensitive device.

* * * * *

UNITED STATES PATENT AND TRADEMARK OFFICE
CERTIFICATE OF CORRECTION

Page 1 of 1

PATENT NO. : 7,745,733 B2
APPLICATION NO. : 11/120025
DATED : June 29, 2010
INVENTOR(S) : George F Jambor It is certified that error appears in the above-identified patent and that said Letters Patent is hereby corrected as shown below:

Column 10,
Line 51, delete "FIG. 1," and insert --FIG. 11,-- therefor.

Signed and Sealed this
Twenty-second Day of March, 2011

David J. Kappos
*Director of the United States Patent and Trademark Office*